United States Patent [19]

Hynecek

[11] Patent Number: 4,599,639
[45] Date of Patent: Jul. 8, 1986

[54] PROCESS PROTECTION FOR INDIVIDUAL DEVICE GATES ON LARGE AREA MIS DEVICES

[75] Inventor: Jaroslav Hynecek, Richardson, Tex.

[73] Assignee: Texas Instruments Incorporated, Dallas, Tex.

[21] Appl. No.: 590,949

[22] Filed: Mar. 19, 1984

Related U.S. Application Data

[62] Division of Ser. No. 365,077, Apr. 19, 1982.

[51] Int. Cl.⁴ .................................................. H01L 29/78
[52] U.S. Cl. ..................................... 357/23.13; 357/51
[58] Field of Search ............. 357/23 GP, 23.1, 23.13, 357/51

[56] References Cited

U.S. PATENT DOCUMENTS 3,676,742 7/1972 Russel et al. .................. 357/23 GP
4,202,001 5/1980 Reichert et al. ...................... 357/22
4,261,004 4/1981 Masuhara et al. ............. 357/23 GP
4,426,658 1/1984 Gontowski ............................ 357/59

OTHER PUBLICATIONS

IBM Technical Disclosure Bulletin, vol. 19, #4, Sep. 1976 "Monolithic Integrated Circuit Fuse Link" by Deliduka et al.

Primary Examiner—Andrew J. James
Assistant Examiner—Mark Prenty
Attorney, Agent, or Firm—Carlton H. Hoel; Robert O. Groover; James T. Comfort

[57] ABSTRACT

Gates of individual devices on a slice are connected through a resistance to the device substrate, and through the same resistance to other device gates. This interconnection and high-resistance drain gives the gate protection from static charge buildup and subsequent catastrophic discharge which would result in a faulty device. This method protects each gate from the time of deposition to final device packaging.

4 Claims, 4 Drawing Figures

PROCESS PROTECTION FOR INDIVIDUAL DEVICE GATES ON LARGE AREA MIS DEVICES

This is a division of application Ser. No. 365,077, filed Apr. 19, 1982.

BACKGROUND OF THE INVENTION

This invention relates to yield improvement in semiconductor device and more specifically to protection of individual device gates on large area metal-insulator-semiconductor devices during all stages of processing.

For purposes of this disclosure, a metal-insulator-semiconductor device denotes a device which has a gate separated from a semiconductor by an insulator. The gate is typically metal, but may be of other material, such as polysilicon.

Large area MIS arrays, such as virtual phase charge-coupled device arrays, are susceptible to static charge build-up and subsequent catastrophic discharge during various phases of the fabrication process. The static discharge can be of sufficient energy to damage, or even destroy, the dielectric layer between the gate and the corresponding opposite electrode, if the breakdown point of the material in the layer is reached or exceeded.

This build-up of static charge is unavoidable since the large area device gate structure acts as a capacitor. The large capacitance represented by the gate can store enough energy to cause the damage to the dielectric layer described above. When the accumulated potential reaches or exceeds the breakdown point of the dielectric, the discharge usually occurs in a localized area, typically the weakest point in the dielectric layer. The discharge of this energy through a small point in the dielectric causes structural damage to the dielectric which is not repairable. The result of this damage is a shortened gate or large dark current spot and therefore, a defective device.

An example of a typical operation which would cause the static build-up is the ion-implantation process. A typical dosage of an implant may cause charging of the gate, relative to the substrate, to a field strength exceeding the dielectric strength of the dielectric layer.

Prior to the present invention, gate protection from static charge build-up was typically confined to the process steps coming after the metallization step which connected the gates to protection devices a such resistors or diodes, usually through metal bus lines.

It is therefore an object of this invention to provide at the time of gate formation, a structure which has a feature that will bleed off the harmful energy build-up or discharge it through an already damaged area on the edge of the slice or where contact is made to the holder, during ion implantation or other process steps.

SUMMARY OF THE INVENTION

In a typical fabrication process, such as disclosed in U.S. Pat. No. 3,914,127, hereby incorporated by reference, a semiconductor slice is divided into a large number of individual units that are regularly spaced from each other and also completely separated by the scribe line, or some other border area for later use in a dicing operation.

On such a slice as described, if no protection is incorporated, each large device will develop at least one discharge-caused defect, and therefore all devices will be useless. However, in the present invention all device gates are interconnected across the scribe lines to form a "super gate", and the breakdown/discharge will occur only in one or a few devices.

In addition to the gate interconnection, among the devices an essential part of the protection is the connection of the gate of each individual device to ground or some reference point through a large value resistor. This connection is made by metallization at an appropriate time in the process prior to dicing of the slice into individual devices. This resistive path from gate to ground or other reference allows charge build-up to be drained off, thereby also protecting the gate during the possible charge build-up caused by the dicing process or subsequent steps performed on individual units. The amount of resistance in the resistive element will be determined largely by the device application. Generally, the resistance should be large enough so as to not interfere with normal circuit operation in the intended application.

The method described here thus provides complete gate protection from deposition all the way to device packaging.

DETAILED DESCRIPTION OF THE INVENTION

Figure 1:
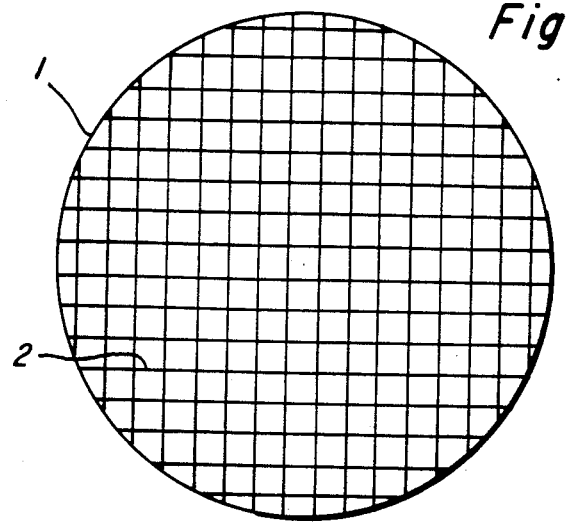
FIG. 1 is a drawing of a typical semiconductor slice as it appears during the manufacturing process.

In FIG. 1, there is shown a typical semiconductor slice as it appears before being scribed to divide the surface into areas on which devices have been constructed. The scribe lines 2 will separate the surface of the slice 1 into individual device islands.

Figure 2:
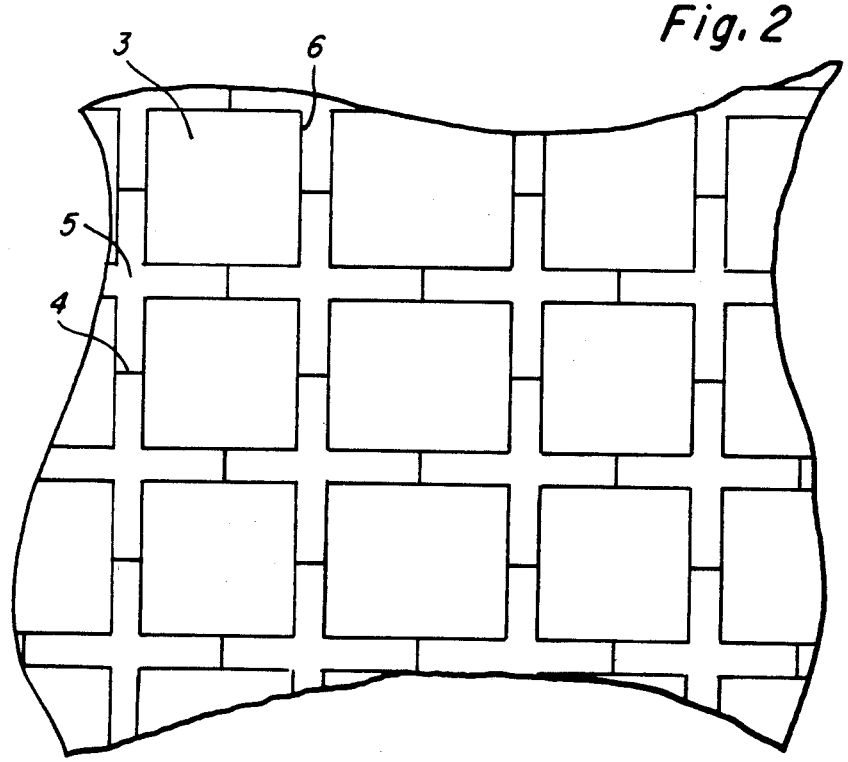
FIG. 2 is an enlarged view of part of the slice of FIG. 1.

The magnification of the surface of the slice of FIG. 1 is shown in part in FIG. 2. Each square 3 represents a device island, separated from each other by the scribe line area 5. Each device is surrounded by a border area 6, which is connected across the scribe line area 5 by an interconnect 4 to the border area of the devices adjacent to it. The border area 6 and the interconnection 4 are fabricated at the same time in the process as the gate.

Figure 3:
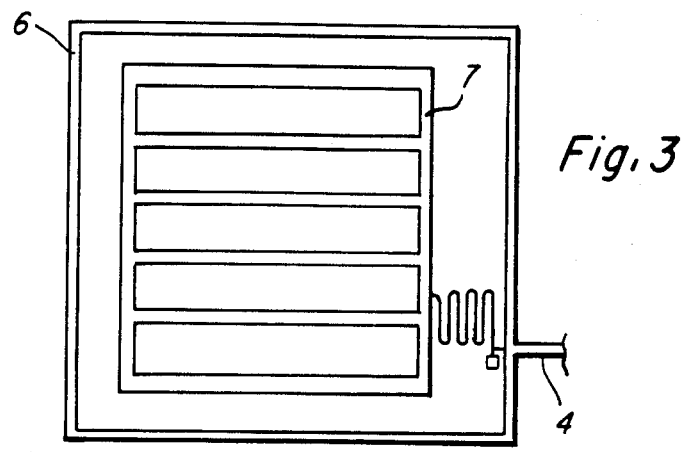
FIG. 3 is a simplified drawing of one of the devices which make up the slice as shown in FIG. 1.

FIG. 3 is a simplified drawing of a large area MIS device, showing the gate interconnect 4, border area 6, and gate 7.

Figure 4:
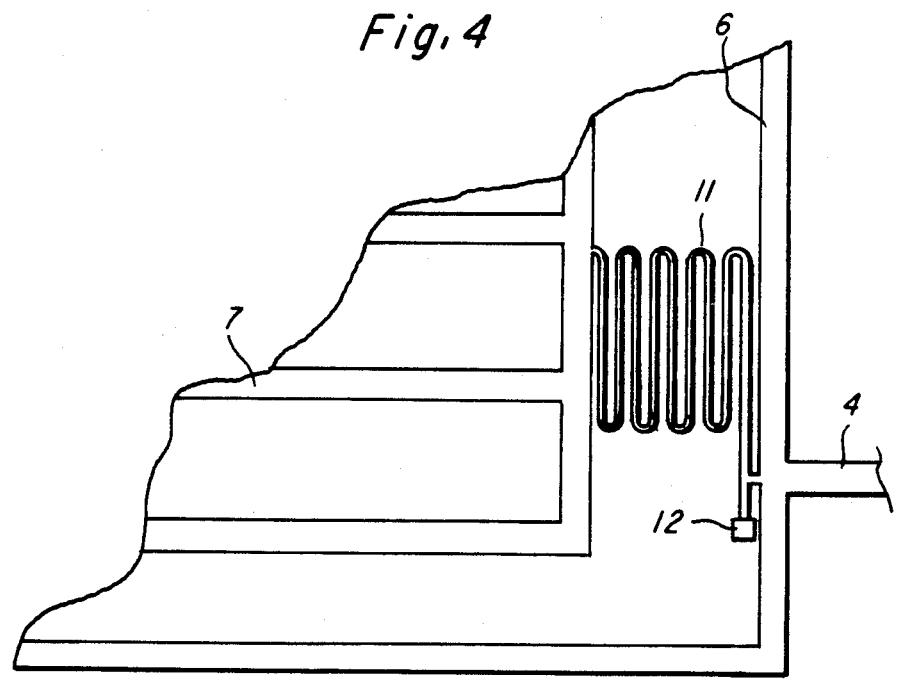
FIG. 4 is an enlarged drawing of the device in FIG. 3 showing more detail.

A magnified view of the device in FIG. 3 is depicted in FIG. 4. The resistance element 11 is connected to ground or a reference, usually the device substrate, through a metallization contact 12. Prior to the metallization step when the contact is made between the resistor 11 and the reference 12, the resistor serves as a connection from the gate 7 to the border area 6. With the interconnect strip 4 in place, device to device interconnection on the slice is accomplished. After the metallization interconnect 12 has been formed in the metallization step, which occurs prior to dicing, each gate is then connected to ground or a reference on the device. The slice can then be diced into individual devices without static damage to any individual gate.

A typical resistance for the resistive element 11 is approximately 100 K ohm. However, values may range from a few thousand ohms to a few megohms, depending upon the device application. The minimum resistance value for a device would be just above that value of resistance that would require a power output of the device that would damage it. An upper limit for the resistance value would be at the point where the resistance is so high it would appear to be an open circuit to the device connected to it, thus providing no protection at all.

The interconnection of gates of all the devices on a slice has the advantage that the protection of all the gates from static charge build-up and resultant discharge through, and break down of, the dielectric is established at the time of gate formation and is maintained all the way through subsequent device processing. This results in a much higher yield of devices from a slice than might otherwise be possible.

The continuous gate protection during device fabrication as described herein is a significant advance in the art of fabrication of large-area MIS devices. While modification and variations of this invention may be attempted, it is intended they be included in the spirit and scope of this invention.

I claim:

1. A semiconductor device with insulated gates comprising:
   (a) a semiconductor substrate;
   (b) a plurality of scribe lines on said substrate in a rectangular matrix arrangement defining a plurality of rectangles, each rectangle including:
   (c) a gate insulated from said substrate;
   (d) a resistor coupled between each said gate and said substrate; and
   (e) a gate interconnection coupled to said resistor, extending across said scribe line and coupled to a resistor of a contiguous rectangle.

2. A semiconductor device as set forth in claim 1, further including an electrically conductive border region extending around the periphery of each said rectangle and coupled to said gate interconnection, plural said gate interconnections extending from said border region to plural different adjacent ones of said rectangles and coupled to resistors therein.

3. A semiconductor device as set forth in claim 1 wherein the resistance of each said resistor is large enough not to interfere with normal circuit operation in the intended application and sufficiently small to drain off charge at a sufficiently rapid rate to prevent catastrophic discharge between said gate and said substrate.

4. A semiconductor device as set forth in claim 2 wherein the resistance of each said resistor is large enough not to interfere with normal circuit operation in the intended application and sufficiently small to drain off charge at a sufficiently rapid rate to prevent catastrophic discharge between said gate and said substrate.

* * * * *